(12) United States Patent
Gore et al.

(10) Patent No.: US 7,355,423 B2
(45) Date of Patent: Apr. 8, 2008

(54) METHOD FOR OPTIMIZING PROBE CARD DESIGN

(75) Inventors: Brooklin J. Gore, Boise, ID (US); Michael R. Allen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 11/420,104

(22) Filed: May 24, 2006

(65) Prior Publication Data

US 2007/0296438 A1  Dec. 27, 2007

(51) Int. Cl.
*G01R 31/02* (2006.01)

(52) U.S. Cl. ..................................... 324/754

(58) Field of Classification Search ............... 324/754, 324/761, 762, 760, 765, 158.1; 29/842, 829, 29/830
See application file for complete search history.

(56) References Cited

U.S. PATENT DOCUMENTS

| | | | |
|---|---|---|---|
| 5,326,428 A | 7/1994 | Farnworth et al. | |
| 5,491,427 A | 2/1996 | Ueno et al. | |
| 5,523,697 A | 6/1996 | Farnworth et al. | |
| 5,736,850 A | 4/1998 | Legal | |
| 5,806,181 A | 9/1998 | Khandros et al. | |
| 6,060,891 A | 5/2000 | Hembree | |
| 6,113,646 A | 9/2000 | Holden | |
| 6,262,586 B1 * | 7/2001 | Furasawa ................ | 324/765 |
| 6,275,052 B1 | 8/2001 | Hembree et al. | |
| 6,359,456 B1 | 3/2002 | Hembree et al. | |
| 6,419,844 B1 | 7/2002 | Krivy et al. | |
| 6,507,800 B1 * | 1/2003 | Sheu ..................... | 702/117 |
| 6,549,863 B1 * | 4/2003 | Morinaga ................ | 702/81 |
| 6,630,685 B1 | 10/2003 | Lunde | |
| 6,714,828 B2 | 3/2004 | Eldridge | |
| 6,773,938 B2 | 8/2004 | Wood et al. | |
| 6,864,105 B2 | 3/2005 | Grube et al. | |
| 6,911,814 B2 | 6/2005 | Miller et al. | |
| 6,912,778 B2 | 7/2005 | Ahn et al. | |
| 6,924,653 B2 | 8/2005 | Schaeffer et al. | |
| 6,924,655 B2 | 8/2005 | Kirby | |
| 7,010,451 B2 | 3/2006 | Dorough et al. | |
| 7,084,656 B1 | 8/2006 | Khandros et al. | |
| 7,092,902 B2 | 8/2006 | Eldgridge et al. | |
| 7,122,829 B2 | 10/2006 | Lunde | |
| 7,168,162 B2 | 1/2007 | Grube et al. | |
| 7,168,163 B2 | 1/2007 | Forbes et al. | |
| 7,170,304 B2 | 1/2007 | Schaeffer et al. | |

\* cited by examiner

*Primary Examiner*—Ha Tran Nguyen
*Assistant Examiner*—Tung X. Nguyen
(74) *Attorney, Agent, or Firm*—Schwegman, Lundberg & Woessner, P.A.

(57) ABSTRACT

A method is presented of designing semiconductor probe cards to have the optimum number and placement of die probe sites for function testing integrated circuit (IC) die at semiconductor wafer test, while minimizing the number of times the probe card must be moved (number of "touchdowns") to test all the IC die on a semiconductor wafer, as well as minimizing the number of individual IC die on the wafer that are probed more than once during the wafer test. Each specific arrangement of probe sites is tested against other patterns for efficiency in testing in what is known as a genetic algorithm. The most efficient patterns are moved into the next generation with modified features obtained by crossovers between two efficient individuals, and with random mutations, until a selected efficiency is obtained, or until a maximum number of generations have occurred.

20 Claims, 4 Drawing Sheets

METHOD FOR OPTIMIZING PROBE CARD DESIGN

TECHNICAL FIELD

This application relates generally to semiconductor devices and device testing and, more particularly, to designing electrical test probe card patterns for parallel electrical function testing of multiple integrated circuit (IC) devices on semiconductor wafers, such as memory devices, logic devices and other integrated circuits.

BACKGROUND

The semiconductor device industry has a market driven need to reduce the time required for function and speed testing of integrated circuits (ICs), in particular during the function testing of IC die on semiconductor wafers at the end of the fabrication process, which may be known as wafer probe, or simply known as probe. A reduction in testing time will result in a reduction in overall device cost, in particular for the high number of relatively low cost memory chips used in virtually every electronic device, since the cost of testing may be a relatively larger portion of the total IC cost in such low priced devices. Since each individual memory chip may be relatively low priced, and because of the large number of individual memory chips that may be used in any single electronic device, even a small reduction in overall memory chip cost may have a large impact on the cost of an electronic device, such as a personal computer.

It is known to electrically test individual IC die at wafer probe with automated test equipment (ATE), which is basically a computer which can electrically drive some or all of the input/output (I/O) pads on the die. Using ATE, it is possible to determine if the application of a particular input vector (i.e., the voltage levels on all of the I/O pads being driven at that moment) results in the correct output vector. A probe test may contain a large number of different input vectors to test as many possible configurations of the die as economically feasible. The interface connecting the ATE to the die is a series of springy wires (probes) arranged on a printed circuit card to contact the die I/O pads.

One method of reducing IC cost is to reduce the amount of time required to test each of the individual memory chips at wafer probe by testing more than a single IC die at a time, using the available number of parallel data paths on a particular testing machine. Clearly, testing two forty pin IC die in parallel would cut the testing time in half, and thus cut testing cost significantly, assuming that the particular testing system has at least eighty parallel data paths. An additional issue is that the interface between the testing system and the IC die, known as a probe card, will have to have twice as many individual electrical contact wires, known as probes, arranged to form two probing sites, one for each of the two IC die that will be tested in parallel. A further issue is that a probe card designed to test more than a single die at a time clearly has to be moved differently than in the previous case of single IC die testing, where the probe card is simply moved to each die in turn.

It is known that each time the wires of a probe site are set down on the input/output (I/O) pads of an IC die (known as a touchdown), there is potential damage to the die, resulting in a potentially defective die after assembly into a package, and thus it is desired that each individual die be contacted by a probe site only a single time, or at least as infrequently as possible. This is easy to do in the previously noted case of testing a single die at a time. In addition, there is a possibility of the wires of the probe site being damaged each time the probe site contacts the I/O pads of an IC die, or the edge of the wafer. Thus, the movement of a multiple die site testing probe card is desirably calculated to minimize the number of times a probe site touches down on incomplete IC die near the edge of a semiconductor wafer.

It is desirable to have the multiple probe site tester card contain as many probe sites as the ATE system can handle in parallel, since this reduces the number of times that the card needs to be moved in relation to the wafer (or equivalently, the wafer moved in relation to the card) to test all of the die on a wafer, and thus may reduce the total testing time. For example, if an ATE has 500 potential parallel data channels, then a 40 pin IC die might be testable in groups of 12 die at a time, using 12 contactor probe sites. It is unlikely that there would be a case where less than all possible die are tested on a wafer, but the invention is not so limited.

Two problems must be solved simultaneously to obtain the various results discussed. First, the contactor configuration must be determined consistent with the maximum number of die that can be tested simultaneously with the ATE being used, and with the locations of the potentially good die on the wafer to be probed. Second, the locations that the probe card will touchdown on the wafer, and the order in which they will be contacted, needs to be determined. These two problems are interrelated and need to be solved together, with additional concern given to the number of die that may be contacted more than once. For example, if the probe card is limited to testing only 12 die at a time, as in the last example, then a wafer having 600 potentially good die will have at least 50 touchdowns, assuming that the pattern of the 12 probe sites, (i.e., the contactor configuration) is arranged so that there are no die that are probed more than once, and that there are no probe sites that ever are positioned over a die that is too close to the edge of the circular wafer to ever be potentially good.

Designing a contactor configuration that meets the needs of testing essentially all potentially good die on a wafer under test, testing as many die simultaneously as the ATE system allows, while not contacting a single die more than once, and minimizing the number of touchdowns on a wafer may not be difficult in cases where the number of die on a wafer is low, but it rapidly becomes difficult when the number of contactors on a probe card increases, as has occurred with newer more capable ATE systems, and as the number of die on a wafer increases, as has occurred with increased miniaturization and larger wafer size.

A method is needed to design semiconductor probe cards having the optimum number and placement of die probe sites for function testing integrated circuit (IC) die in parallel (i.e., testing more than a single die at a time) at wafer probe test, while minimizing the number of times the probe card must be moved to test all the IC die on a semiconductor wafer, as well as minimizing the number of individual IC die on the wafer that are probed more than once during the wafer test. With such an arrangement, the amount of testing time at wafer probe may be reduced in proportion to the number of IC chip tested in parallel.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

The invention provides a method for determining an optimal probe card configuration of contactor locations, with each contactor location representing an array of electrically conductive probes positioned to connect a test system, such as an ATE, to the I/Os of a single integrated circuit (IC) die on a semiconductor wafer. The invention may also provide a probe vector, which is a list of points, with one point per touchdown, which indicate where to place the probe card having the pattern of contactor locations with respect to the wafer being probed. The invention may also provide a list of which ones of the contactor locations will be active (i.e., the probes of that contactor location will all be connected to an I/O pad) for each touchdown, and may provide a list of the die that will be contacted more than once during the probing of all potentially good die on the wafer.

The calculation of the optimal probe card configuration of contactor locations requires a wafer map with the locations for all potentially good die, specifically those die having a sufficient distance from the edge of the wafer to be whole die. This is due to the wafer typically having a circular shape, while the die typically have a rectangular shape, resulting in some die having portions cut off by the wafer edge. The calculation also requires a limit on the size of the probe card, the number of parallel data paths available on the ATE (which limits the number of potential probes on the probe card), and how many touchdowns are permitted.

Figure 1:
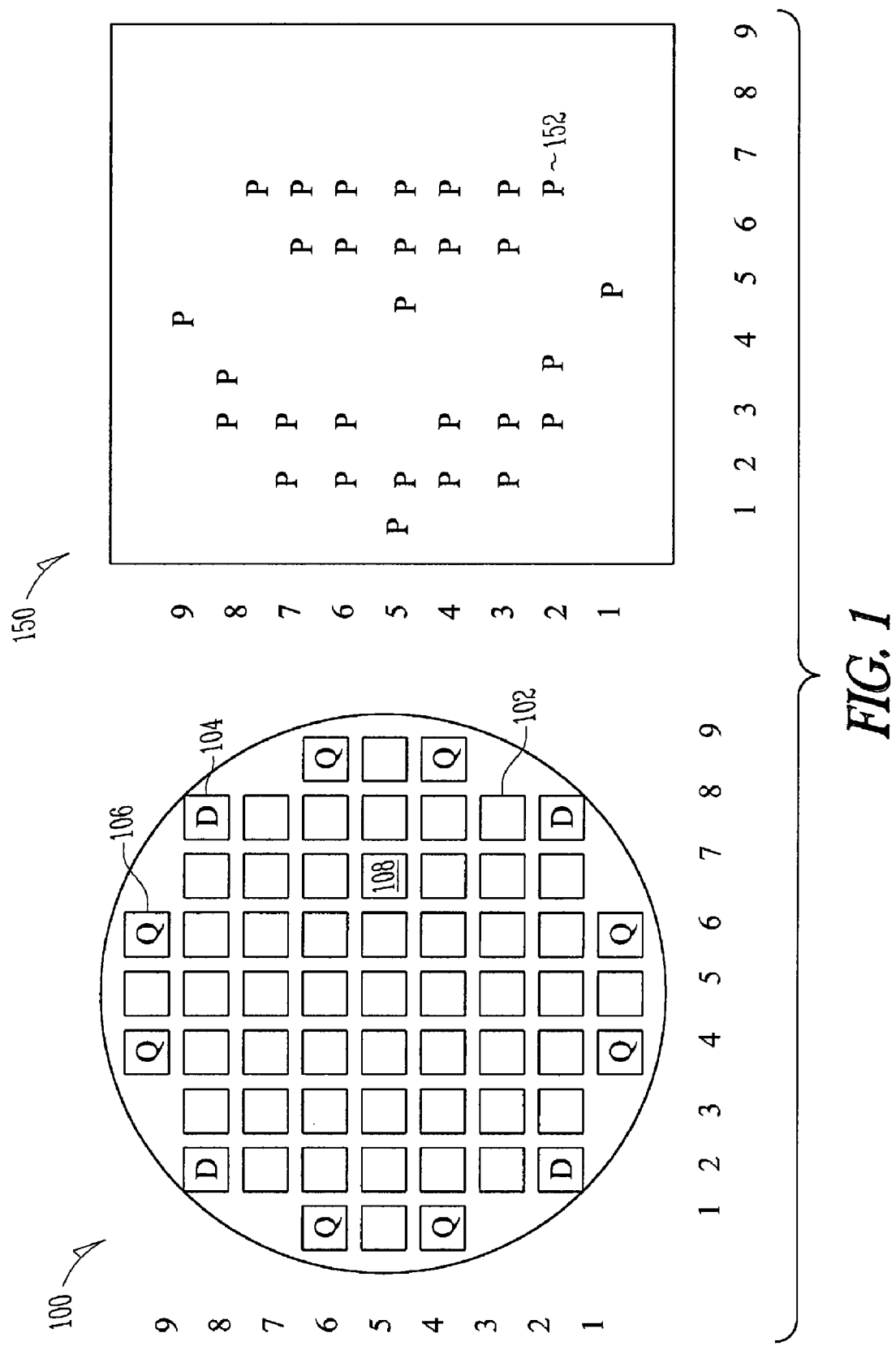
FIG. 1 illustrates an embodiment of a wafer and probe card in accordance with an illustrative embodiment.

FIG. 1 illustrates a semiconductor wafer 100 having a number of potentially good die such as 102, in a partial 9 by 9 matrix in this illustrative embodiment. The circular shape of the semiconductor wafer 100 results in a number of the square die being placed at least partially off of the wafer and thus essentially always bad. For example, die number 104 is shown as having a corner that is positioned off the wafer 100, and is very likely to be a non-functional die, as are the other three die marked D. Similarly, die number 106 (marked with a Q for questionable) is shown in this illustrative embodiment as having a corner that is near the edge of the wafer 100, and thus likely to be scratched during fabrication, or to have a crystalline defect due to the proximity to the wafer edge. Whether it is economically feasible to test the eight die marked Q on this illustrative wafer having the same proximity to the edge issue as die 106, may depend upon the market value of the specific function designed into the die, such as a high value microprocessor, and the known probability of the edge die being functional. The positions of the die that are to be tested are provided to the calculation, for example as the X and Y location of the lower left corner of the die. The described illustrative embodiment is a semiconductor wafer having part of a nine by nine matrix of die, as indicated by the horizontal and vertical numbers, but the invention is not so limited, and may include small printed circuit boards fabricated as a group as part of a larger board, and may have any number of individual tested elements.

FIG. 1 also shows a tester card 150 having a number of probe sites P, such as the probe site 152, each of which probe sites has a number of individual probes to contact the I/Os of one of the die 102 on wafer 100. The pattern of probe sites, that is the number and location of the individual die to be tested at the same time, is known as a probe card configuration. In this illustrative embodiment, the nine by nine matrix has only 49 potentially good die on wafer 100, excluding those marked D and Q, and the probe card 150 has 29 probe sites. If the probe card 150 has the initial touchdown such that the lower left corner (i.e., the 1:1 location where the horizontal X axis has a value of 1, and the vertical Y axis has a value of 1) is over the 1:1 location of the wafer, then 29 potentially good die will be tested. The second location in the illustrative probe vector will result in the 1:1 location of the probe card 150 being aligned with the 3:1 location of the wafer 100, which may also be looked at in this simplified illustrative embodiment as moving the probe card 150 two die locations to the right. In the described illustrative embodiment, there is one die (marked 108 and at location X=7:Y=5) that is contacted twice during the two touchdowns of the described probe vector.

The described method of designing semiconductor probe cards results in a probe card that has the optimum number and placement of die probe sites for function testing integrated circuit (IC) die in parallel at semiconductor wafer probe test. The probe cards also minimize the number of times the probe card must be moved to test all the IC die on a semiconductor wafer, as well as minimizing the number of individual IC die on the wafer that are probed more than once during the wafer test. Each specific potential arrangement of probe sites on a probe card, known as an individual, is tested against other individuals (that is other potential probe arrangements) for its efficiency in testing the semiconductor wafer die sites in what is known as a genetic algorithm. A group of the most efficient individuals (i.e., the best probe patterns) are moved into the next generation with modified features obtained by genetic crossovers between two efficient individuals, and with random mutations, until an individual having selected efficiency is obtained, or a specified number of generations have passed without improvement in efficiency, or until a maximum number of generations has passed. With such an arrangement, the amount of testing time at wafer probe may be reduced, depending upon the number of IC chip tested in parallel and the number of times the probe card must be moved to contact and test every possible good IC die on the wafer.

An illustrative embodiment of the invention includes a method of designing a probe card for electrically testing die on a wafer in parallel, including determining a plurality of parameters of interest in the probe card design. Such parameters include information provided by the probe card designer, and default values for parameters not provided, and may include parameters such as the number of die on the wafer, the location of potentially good die to be tested on the wafer, a maximum allowable size of the probe card, a maximum number of probe sites, a maximum number of times the probe card can touch the wafer, a maximum number of times any single individual die may be probed, a maximum number of die that may be probed more than once, stop criteria, selection criteria, evaluation criteria, population size, population alteration criteria, fitness criteria, crossover probability, mutation probability, reproduction probability, number of copies to use in reproduction, and an initial generation counter value.

After determining the parameters of the problem, the method may then create an initial population of individual probe card contactor test site patterns of a selected size that remains within the problem parameters. The initial population may be any size, and defaults to 400 in an embodiment. The initial population may be formed by any method, and in one embodiment a totally random set of test site contactor patterns is created, remaining within the problem parameters. In another embodiment, the initial population is created by mutating one or more provided individual patterns, including existing probe card patterns from similar type and size die and wafers. Once finished creating the initial population, the individual patterns, which may be referred to simply as individuals, may be tested for their ability to do the die test, or may be sent to the tournament. In either case, the initial population has its name changed to a current population and a generation counter incrementing by one.

The individuals may be evaluated in various ways, including a tournament of several individuals, in an embodiment defaulting to four individuals, for determining which individual is best at performing the die test, which may be known as fitness, and a fitness value is assigned to each individual. In an embodiment the fittest individual is the one that has the lowest fitness value. The fitness value may be determined in an embodiment by a formula having weighting factors for each design feature of greatest interest denoted by various W with subscripts. In an embodiment the formula is $F=(Wu)(Unprobed)+(Wd)(DUTs)+(Wt)(Touches)+(Wr)(Re-probe)$. In an embodiment, all tournament contestants are returned to the current population, while a copy of the winning individual is placed in a new population. This contest continues until the new population is big enough. In an embodiment, the new population is the same size as the current population.

The winning individual may also be altered and placed in the new population, or only the altered individual may be placed in the new population. The alteration may occur with a probability determined by a random number compared to either a provided, or a default probability of either or all of mutation or crossover (or reproduction). Default values in an embodiment are 75% for mutation and 75% for crossover with another individual. In another embodiment, the mutation default value is 100%. The altered individuals are copied to the new population, until the new population has reached the selected size.

The method may then evaluate each individual of the new population against a stop criteria and ending the method if a stop criteria is obtained. The stop criteria may include a selected fitness value, a maximum number of generations, and stopping if there is no substantial change in either the best individuals fitness rating, or if the average fitness rating has no substantial change over the course of a number of generations of the genetic algorithm.

If the stop criteria are obtained the method ends. If there is no stop criteria met, the new population is copied to a current population, thus replacing the previous current population, and the generation counter is incremented by one. This continues until the stop criteria are obtained.

The genetic algorithm is described using the illustrative example of a probe card design for testing die on a semiconductor wafer, but the invention is not so limited. It may easily be imagined how any device that is manufactured in a batch process or on a larger substrate, and requires testing before final assembly, may benefit from slight modifications of the described method. Examples may include manufacture of what are known as SIM cards, flash memory sticks, small printed circuit cards manufactured in parallel on large boards, and micromechanical devices (MEMs).

Figure 2:
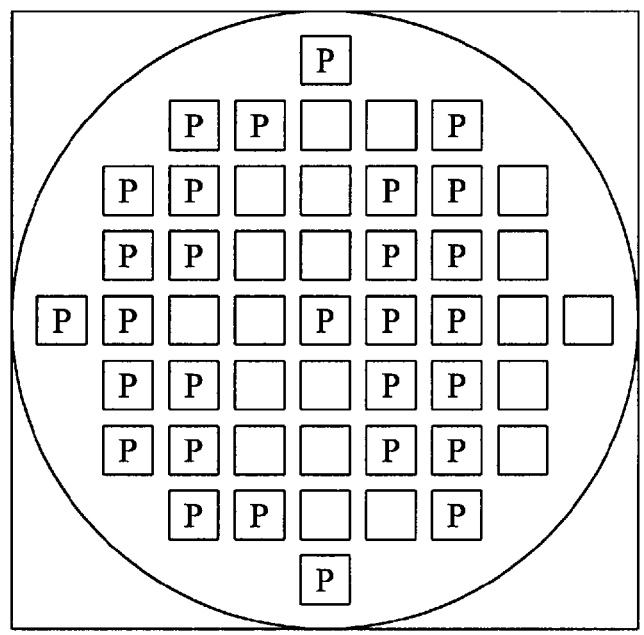
FIG. 2 illustrates a potential alignment of the wafer and probe card from FIG. 1.

FIG. 2 illustrates the positioning of the initial touchdown of the probe card 150 on the wafer 100, with the probed die shown marked with a P. During this illustrative and simplified embodiment, there are 29 potentially good die being tested at the same time. The defective and questionable die of wafer 100 (those that are marked with a D or a Q in FIG. 1) have not been shown in this illustration since they are not to be tested, and to increase the clarity of the described example.

Figure 3:
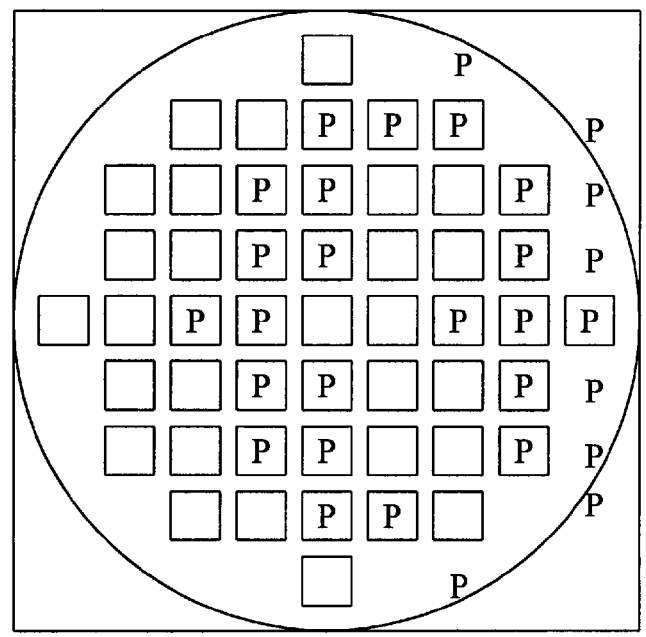
FIG. 3 illustrates a second potential alignment of the wafer and probe card from FIG. 1.

FIG. 3 illustrates the position of the second touchdown in this illustrative probe vector, where the probe card 150 has been moved two die to the right, such that the 1:1 position of the probe card (the lower left corner where the horizontal X axis number is 1 and the vertical Y axis number is 1) is aligned with the 3:1 location on the wafer 100. Again the die being contacted and tested during the second location of this illustrative probe vector are marked with a P. Note that the die at location 7:5 (and labeled 108 in FIG. 1) is contacted during both touchdowns, which is an undesirable situation due to potential damage to the probe card and the die, but is a factor to be minimized by the method to be described below. Also note that eight probe sites are now located off of the wafer to the right, which is also a somewhat undesirable situation, and may also be a factor used in determining the optimal probe card configuration.

Due to the generally circular shape of the typical semiconductor wafer and the rectangular shape of the typical probe card and die, there is a tendency for the optimal probe configuration or pattern to have a misshapen donut appearance, but the invention is not so limited. The solution described is a simplified version of a probe card configuration (in this illustration having 29 probe sites) combined with a probe card vector (in this illustration having two touchdowns) to test essentially all the potential good die (in this illustration 49 die) with a minimum of die being contacted more than once. In general the probe card vector will likely not be a simple two steps to the right from the origin of the numbering axis, but may start in negative values of both horizontal and vertical axis, and typically will move in both the horizontal axis (as in this illustration) and vertical axis directions.

In general, the problem may be looked at a simultaneously finding a solution that reduces the over all probe time for an entire wafer, which is related to the number of touchdowns required to test essentially all potentially good die on the wafer, reduces the cost of the probe card, which is related to the number of required contactor or probe sites, minimize the number of die that are contacted more than once (known as re-probed), minimizing the maximum number of times that any die is touched, while staying within the boundaries of the maximum number of parallel data lines available in the ATE being used for the testing.

To determine the optimal probe card configuration and the optimal probe vector, it is possible to use what is known as a genetic algorithm. The possible number of configurations is very large, since the number of die on a wafer is large and the optimal solution could have from one contactor to W contactors, where W is the number of potentially good die on the wafer to be tested. For most cases the number of contactors (K) will be less than half the number of die, and so the number of touchdowns (T) becomes a variable as well. The number of possible configurations of contactors will be a summation over all possible contactor locations K taken k number of contactors in a possible pattern. Thus, the total number of configurations $N=\Sigma[(K!)/(k!(K-k)!)]$. This is approximately equal to $N=2^K$, which in a typical case of a probe card having an array of 10 by 10 probe sites is $2^{100}$ which is a large number. Taking into account that the number of probe card vectors (V) is also large and varies by the number of touchdowns (T), which will be much lower than the number of possible die sites W, $V=[(W!)/(T!)(W-T)!]$, which is approximately $W^T$. In a typical case where the number of die on a wafer W is about 500, and the number of touchdowns would be at least 5 (i.e., 100 probe sites requires at least 5 touchdowns to test 500 die) this is again a large number. The total number of possible configurations and probe vectors is then $2^K W^T$, which is about $4 \times 10^{43}$ possible combinations of probe sites and probe vectors using 5 touchdowns of a 100 probe site test card on a wafer having 500 potentially good die.

Figure 4:
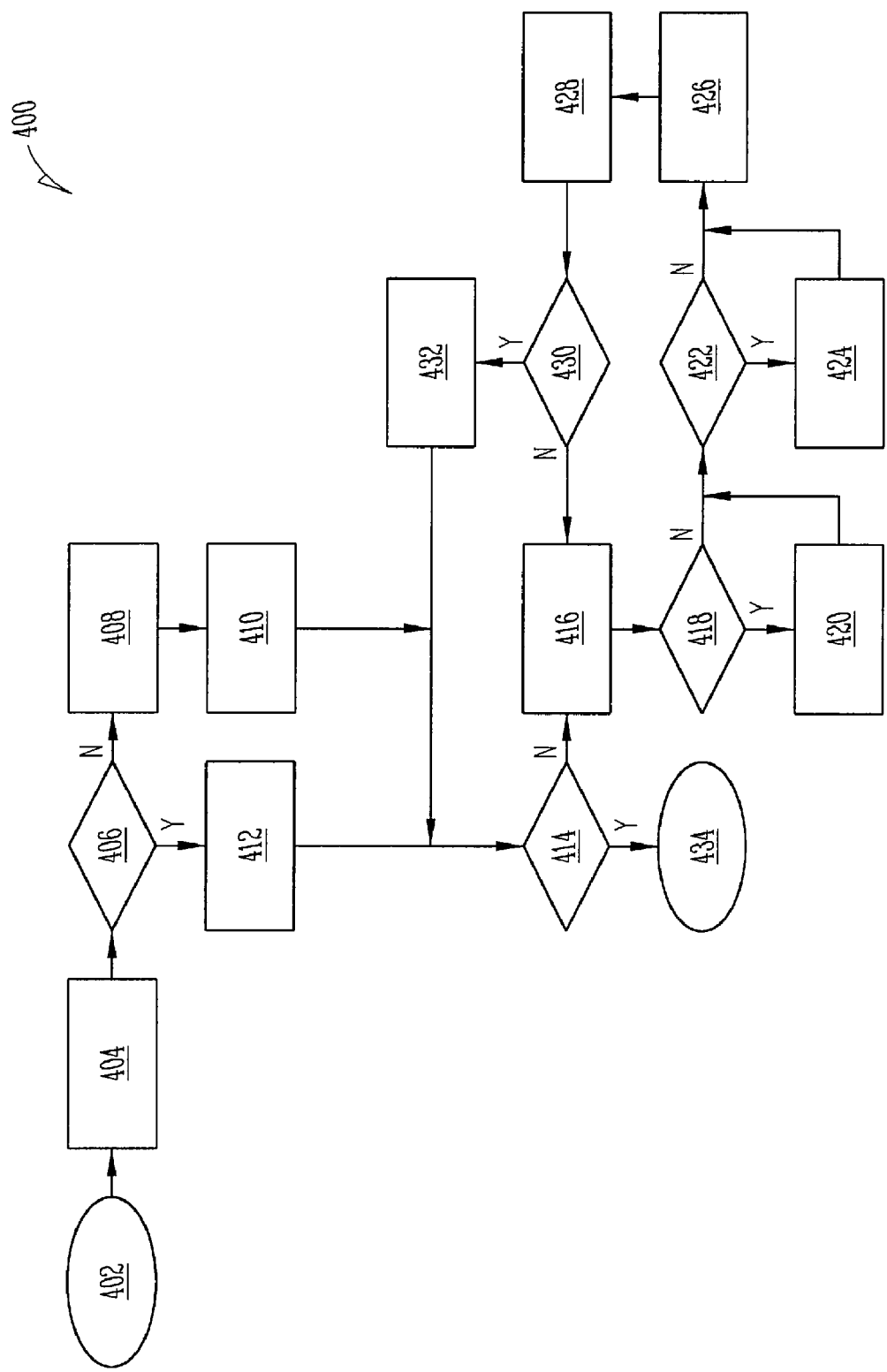
FIG. 4 is a flowchart of the method in accordance with an illustrative embodiment.

FIG. 4 is a flow diagram showing the method for optimizing probe card design using a genetic algorithm with weighting factors or probabilities for at least three genetic algorithm operators, fitness or efficiency, crossover and mutation. A genetic algorithm tests each one of an initial population of individuals (in this case probe site patterns) to see which ones fulfill the requirements (in this case the number of probe sites, the number of touchdowns in the probe vector, whether all die have been tested, how many die re-probed) the best.

To obtain a new (and better overall) population of individuals, the most fit (i.e., the patterns that work the best) are placed in the new population, but with a certain selected probability of having the features of one fit individual crossed over with the features of another fit individual, or by having random mutations made in the fit individual's features, such as moving a probe site to a previously unoccupied position.

The illustrative method starts at 402, and then determines the parameters of the problem at 404 from the input conditions. The input conditions may include a wafer map showing the coordinates of the potentially good die that are to be tested, the maximum probe card size, including the maximum number of probe sites that the ATE system can handle, and a maximum number of probe card touchdowns to be allowed. Other conditions may also be entered at this point, such as a maximum number of times that a single die may be re-probed, or a maximum number of die that may be re-probed, as discussed above. The illustrative method may initialize variables, such as an initial population of individuals (individual patterns of probes sites as shown in FIG. 1, and probe card movement vectors as shown in FIGS. 2 and 3) and determines whether to do this randomly or by generating variations on a provided pattern at 406. The initialization method may use an initial individual provided by a user at 408, or by selection of random individuals at 412. The initial individual at 408 may be a best guess by a probe card designer or an existing probe card design from a similar IC device, and may help speed the design method by providing an initial pattern that is believed to be close to the optimal pattern. The illustrative method may create a population of individuals at 410 from the provided individual by means of making a single different mutation to each copy of the provided individual. For example, if the provided individual was the probe card pattern 150 of FIG. 1, then the initial population could contain one copy of this initial pattern, perhaps called version zero, and one copy of a version one, where the probe site labeled 152 at location 7:2 of version zero is removed and placed at currently vacant probe site location 7:1. Version two would have some other random single point mutation, and so on until a predetermined number of individuals are available to form an initial current population. Alternatively, other methods of providing variations on one or more provided individuals may be easily imagined and several such methods will be described below with reference to the genetic algorithms. There may also be more than one copy of each version used to form the population, and there may be testing of the generated individuals at 410 to remove variations that produce clearly poor results. The generated population may be of any size, but in general will vary from about a hundred to a thousand individuals, preferably 200 to 800, and in an embodiment will default to 400 individuals, unless otherwise instructed.

Alternatively, the illustrative method may form the initial population by totally randomly generated individuals at 412. This may reduce the amount of human time and cost involved in generating sample patterns or individuals for the illustrative method to modify. There may be limits imposed on which random patterns are allowed into the initial population, for example by means of a screening program that tests the functionality of the randomly generated individuals, or applies certain limitations to the patterns, but this is not required for the method to produce optimal probe card site patterns and movement vectors. There may also be a general starting pattern that may be known in the particular technology, such as the illustrative wafer probe testing. In this particular illustrative embodiment of testing die on a circular wafer with probe sites located on a rectangular card, as noted previously, the typical optimal probe card has an elliptical donut shape that is slanted from one corner to the opposite corner. Thus, it is possible to provide an initial population sample to improve the calculation time without difficulty, using the problem domain knowledge of the user.

After the initial population, now known as the current population, is generated, the method may check to see if the stop criteria have been met at 414, or the initial population (which will be very unlikely at this early point in the method to have met the stop criteria) may be directly sent to the fitness test at 416. The stop criteria may be applied to each new "current" population at the end of each evolutionary cycle of the genetic algorithm to determine, for example, whether a limit to the number of generations has been reached, or whether at least one of the individuals has reached a figure of merit level that may include testing all of the die, not exceeding the maximum number of touchdowns or number of die re-probed, or whether the figure of merit has not changed by more than a selected amount during the past predetermined number of generations. If the current population reaches the stop criteria, then the illustrative method ends at 434, and outputs the one or more individuals that meet the stop criteria, or the best rated individuals.

At 416, the individuals are tested for fitness, or how well they test the die. This may be done by means of what is known as a tournament. A tournament tests at least two randomly selected individuals for their ability to test the die on the wafer most efficiently, and places the winner into the new population. In an embodiment the winning individual is also left in the current population, so that the next random selection of tournament participants may include this relatively fit individual. There may be a fitness number providing a relative valuation of each individual assigned to the individual and recorded with the other variables such as probe configuration or pattern, and the probe card vector. The fitness number may be used to determine when a particular individual has reached the stop criteria.

The winner may, or may not, be subjected to mutation at 418 and 420, either a single point mutation as described previously, or a multiple point mutation, and may or may not be subjected to a crossover exchange of features with a winner from another tournament at 422 and 424. The decision to mutate, or cross over, or both, with an individual moving on to the new population may be determined by forming a random number at 418 and 422 within predetermined ranges, and performing the mutation at 424 or crossover at 420 if the random numbers are less than predetermined values provided by either the user at step 404, or by a default value. Other methods of determining fitness besides the described tournament may be used, such as setting a figure of merit as a cutoff for the particular generation (i.e., the number of times the genetic algorithm has gone through the selection process) of the illustrative method, or by evaluation of the entire population and ranking the results, perhaps by means of a figure of merit, or other methods of determining the relative value of an individual as may be easily imagined.

After the potential cross over and mutation operations, each individual may be re-evaluated for fitness since there is a possibility that the mutation or cross over operations may have produced at least one individual that meets or exceeds the stop criteria. In this way the genetic algorithm evolves a population of individuals through repeated selection, possible crossover and possible mutation. In the illustrative example there are two populations, the current population that is undergoing selection and potential feature changes, and the new population of those fittest individuals with some potential variations in features from the previous population. At the end of each selection tournament and possible feature variation via mutation or crossover or both, the illustrative method adds the selected individual to the new population at 428, and checks to see if there are enough members of the new population to fill the desired population size at 430. As noted previously, the population size chosen may be of any number, but in an embodiment the method defaults to a population size of 400. If the new population is full, then the new population replaces the current population by being copied over as the new current population at 432. If the new population is not full, then the illustrative method returns to step 416 and selects two or more individuals from the current population (which may typically still include all the original members, including those selected to go to the new population and to potential mutation).

Once the new population is full and is copied to replace the current population at 432, the illustrative method returns to step 414 to determine if the stop criteria have been obtained by at least one individual.

The illustrative example of probe card design may use a tournament size of from two to eight or more, and an embodiment has a default size of four individuals. Since the illustrative tournament randomly selected the participants, it is possible that the best individual in the current population may not be chosen for the tournament, and thus be left behind when the new population is full, and thus effectively become extinct. The illustrative example may handle this issue in several ways, including placing tournament winners and losers in separate temporary holding locations until every member of the current population has been selected for the tournament, and then returning all current population individuals to the current population and continuing the tournaments until the individuals selected for the new population have been determined. Alternatively, a technique which may be known as elitism guarantees that one or more of the best individuals are moved on to the new population regardless of whether or not they have been selected for a tournament. In the illustrative example, the selection of individuals that will go to the new population without a selection process, such as the described tournament, may be performed between steps 414 and 416, by selecting all the individuals that have a figure of merit at step 414, and transferring a copy of the individuals directly to the new population at step 428. In an embodiment, elitism may be an option selected by the user, but is not a default setting.

In the illustrative example, the process of crossover between two selected fit individuals mixes a portion on one individual's solution with another individual, and may occur by selection of a rectangular area of random size within prescribed limits (i.e., the size must be smaller than the size of the probe card) and location, and swapping the pattern inside the rectangle between two individuals. If the randomly selected size is a one by one area, then the crossover results in a single probe site swap. If the randomly selected size is the entire probe card, then the crossover results in two individuals simply being swapped, with no change in the new population. There may be a need to ensure that there are no shape or contactor number minimum or maximum value problems that result from the crossover operation. In an embodiment, the crossover operation is not always performed, but has a probability of occurrence that is controlled by a predetermined range varying from 0.0 to 1.0, and having a default value of 0.75, that is if the randomly selected value of Pc at 418 is less than 0.75, then crossover occurs. Crossover mixes known good solutions to help prevent the genetic algorithm from becoming stuck at what may be known as a local maximum solution, and not obtain the optimal solution.

In the illustrative example, the process of mutation provides totally new solutions to the existing population, and again occurs with either a predetermined probability ranging from 0.0 to 1.0, or with a default value, which in one embodiment is 0.75, and in another embodiment is one, i.e., every individual receives a point mutation. If the randomly selected probability at 422 is less than Pm, then mutation occurs in that individual before it is added to the new population. The mutation process may take different forms, but an embodiment randomly selects a probe contactor site location, and if the location is currently vacant, then a contactor is added to that location. If the contactor site is currently occupied, then the contactor is removed. As noted previously, the new individual may be checked to ensure that no shape or contactor number minimum or maximum value problems result from the mutation.

The described illustrative example includes determining the placement of the described individual probe patterns to test essentially all of the die on the wafer within a predetermined number of touchdowns of the probe card on the wafer. In an embodiment the difference in size between the wafer and the probe card is determined, and a difference rectangle is created, and aligned with the lower left hand corner of the wafer, shown as location 0:0 in FIG. 1. An ellipse is aligned with the lower left to the upper right of the difference rectangle, and divided into a random number of equal length sections, where the random number is less than the maximum predetermined number of touchdowns. Probe vectors are randomly selected around the ellipse and the fitness of the probe vector selection is determined. The process of selecting random probe vectors continues until a solution is found that has a specified efficiency (determined by a fitness number or figure of merit), or until a maximum number of attempts have been made for this individual probe contactor test pattern.

In an embodiment, the fitness of an individual may be a single large number that characterizes the quality of the solution to the problem. In an embodiment, fitness is minimized, because the calculation comprises a series of individual characteristics that need to be minimized. An embodiment of a fitness function is $F=(Wu)(Unprobed)+(Wd)(DUTs)+(Wt)(Touches)+(Wr)(Re-probe)$, where Wu is the weighting factor for die that are not tested (i.e. unprobed), Wd is the weighting factor for the number of probe contactor sites (which is the number of die (or devices) that may be under test simultaneously, i.e., DUTs), Wt is the weighting factor for the maximum number of times a single die on the wafer may be re-probed, i.e., Touches), and Wr is the weighting factor for the number of different die that are re-probed more than once. The weighting factors may be set at step 404 by the user, and may be set from zero to a billion. In an embodiment, the weighting factors have default values of Wu is one million, Wd is one thousand, Wt is one hundred, and Wr is one. In this embodiment, the weighting factor for unprobed die is so high that there can be no individual reaching the stop criteria that has a single untested die on the wafer. On the other hand, an individual may reach the stop criteria even if it re-probes each and every die on the wafer one time. This is one choice of a set of default values that may obtain an optimal solution in wafer probe card design, and different solutions may require different weighting factors depending upon the specific problem to be solved. As an illustration, if a test probe card for testing low cost operational amplifier die were being designed, then missing test on a single die out of the thousands of potentially good die on a wafer may not require such a large value for Wu.

The stop criteria may have many different values, but an embodiment has the fitness value, as calculated by the fitness function (F) above, below 100,000 meaning that there can be no unprobed die, and no more than 100 contactor locations on the probe card. An embodiment has a stop criterion of the number of generations being 500, and a reduction in the fitness value from one generation to another of less than 4%.

Figure 5:
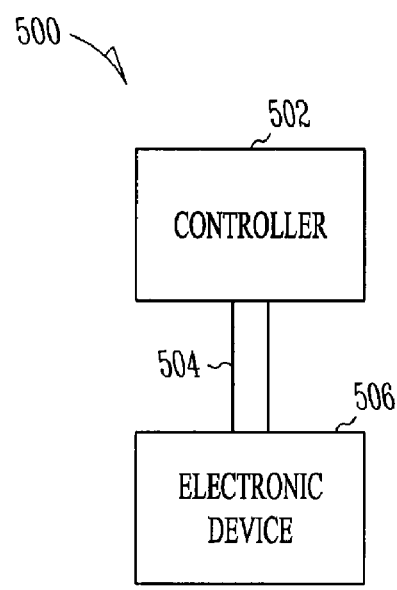
FIG. 5 is a block diagram of an electronic device in accordance with an embodiment of the invention.

FIG. 5 is a block diagram of a general electronic device in accordance with an embodiment of the invention with an electronic system 500 having one or more devices tested according to various embodiments of the present invention. Electronic system 500 includes a controller 502, a bus 504, and an electronic device 506, where bus 504 provides electrical conductivity between controller 502 and electronic device 506. In various embodiments, controller 502 and/or electronic device 506 include an embodiment for a portion of the device having IC die tested as previously discussed herein. Electronic system 500 may include, but is not limited to, information handling devices, wireless systems, telecommunication systems, fiber optic systems, electro-optic systems, and computers. In an embodiment, the electronic system 500 is a tester for carrying out the methods and steps described herein. The controller 502 is a computing device to carryout the methods described herein. The electronic device 506 is a tester with probes to contact a wafer or dies.

Figure 6:
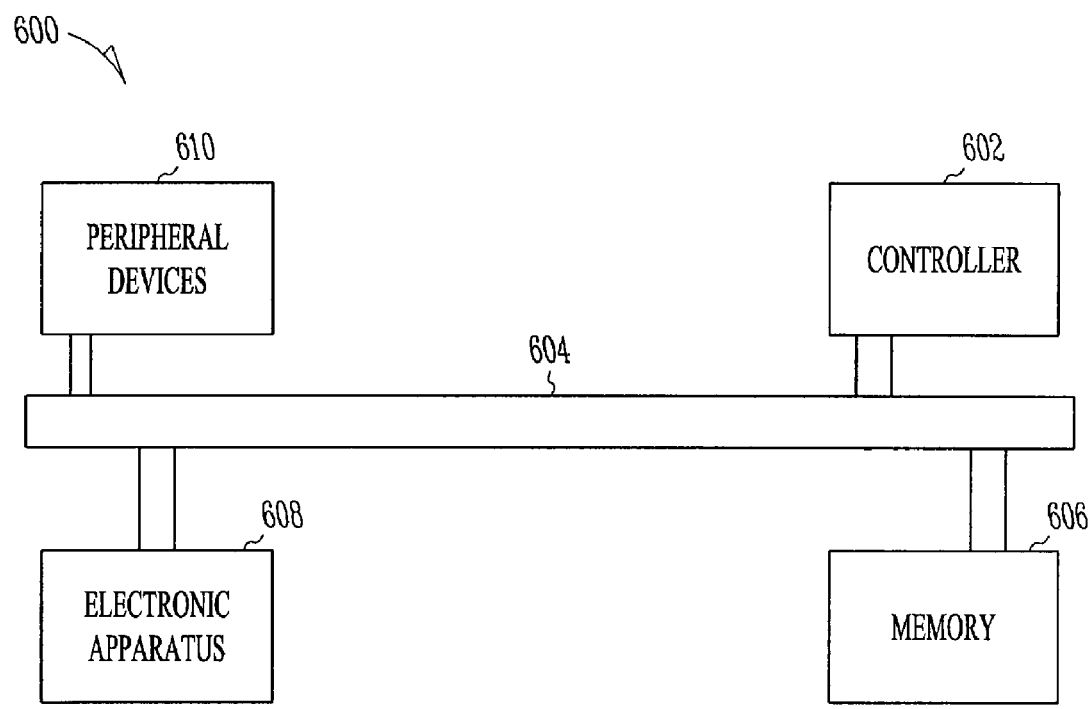
FIG. 6 is a diagram of an electronic system having devices in accordance with an embodiment of the invention.

FIG. 6 depicts a diagram of an embodiment of a system 600 having a controller 602 and a memory 606. Controller 602 and/or memory 606 include a portion of the circuit having IC devices and memory chips tested in accordance with the disclosed embodiments. System 600 also includes an electronic apparatus 608, and a bus 604, where bus 604 may provide electrical conductivity and data transmission between controller 602 and electronic apparatus 608, and between controller 602 and memory 606. Bus 604 may include an address, a data bus, and a control bus, each independently configured. Bus 604 also uses common conductive lines for providing address, data, and/or control, the use of which may be regulated by controller 602. In an embodiment, electronic apparatus 608 includes additional memory devices configured similarly to memory 606. An embodiment includes an additional peripheral device or devices 610 coupled to bus 604. In an embodiment, controller 602 is a processor. Any of controller 602, memory 606, bus 604, electronic apparatus 608, and peripheral device or devices 610 may include ICs tested in accordance with the disclosed embodiments. System 600 may include, but is not limited to, information handling devices, telecommunication systems, and computers. Peripheral devices 610 may include displays, additional memory, or other control devices operating with controller 602 and/or memory 606. In an embodiment, the system 600 is a tester for carrying out the methods and steps described herein. The controller 602 is a computing device to carryout the methods described herein. The memory stores data and computational results and probe card designs as described herein. The peripheral device 610 is a tester with probes to contact a wafer or dies.

The described embodiments are directed towards design of typically hollow elliptical patterns of test sites used to test IC die on round wafers using rectangular probe cards, but the invention is not so limited, and may be applied to non semiconductor wafer devices, such as rectangular arrays of printed circuit boards (PCBs), liquid crystal display devices, micro-electromechanical devices (MEMs), or other repetitive manufactured arrays requiring testing.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A method of designing a probe card for electrically testing die on a wafer in parallel, comprising:

determining a plurality of parameters;
creating an initial population of individual probe card contactor test site patterns having a selected size;
copying the initial population to a current population and incrementing a generation counter by one;
determining which individuals in the current population are fittest and assigning a fitness value to each individual;
determining whether to at least one of alter and reproduce a plurality of selected individuals determined to be fittest from the current population;
copying the selected individuals and fitness values to a new population;
determining if the new population has reached the selected size;
continuing to determine selected individuals to copy to the new population until the new population reaches the selected size;
evaluating each individual of the new population against a stop criteria and ending the method if a stop criteria is obtained;
copying the new population to a current population and incrementing the generation counter by one; and
continuing with determining which individuals in the current population are fittest until the stop criteria are obtained.

2. The method of claim 1, wherein the parameters are selected from the list including the number of die on the wafer, the location of potentially good die to be tested on the wafer, a maximum allowable size of the probe card, a maximum number of probe sites, a maximum number of times the probe card can touch the wafer, a maximum number of times a die may be probed, a maximum number of die that may be probed more than once, stop criteria, selection criteria, evaluation criteria, population size, population alteration criteria, fitness criteria, crossover probability, mutation probability, reproduction probability, number of copies to use in reproduction, and an initial generation counter value.

3. The method of claim 1, wherein the initial population is created by altering a single provided probe card pattern via single point changes in the position of a randomly selected probe card contactor test site.

4. The method of claim 1, wherein the initial population is created by randomly populating contactor test sites on a probe card.

5. The method of claim 1, wherein the initial population includes from 200 to 800 individual probe card patterns.

6. The method of claim 5, wherein the initial population has a default value of 400.

7. The method of claim 2, wherein determining which individuals in the current population are fittest includes randomly selecting a plurality of individuals from the current population and calculating how well each individual operates to test the die on the wafer.

8. The method of claim 7, where the plurality of individuals is four.

9. The method of claim 7, where at least the individual that tests the die on the wafer best is assigned a fitness value (F), where $F=(Wu)(Unprobed)+(Wd)(DUTs)+(Wt)(Touches)+(Wr)(Re\text{-}probe)$, where Wu is a weighting factor for the number of untested die (Unprobed), Wd is a weighting factor for the number of probe contactor sites (DUTs), Wt is a weighting factor for the number of times any single die is re-probed (Touches), and Wr is a weighting factor for the number of different die that are re-probed more than once (Re-probe).

10. The method of claim 9, where the weighting factors are provided during the determining parameters step and may be set from zero to a billion.

11. The method of claim 9, where the weighting factors have default values of Wu equals one million, Wd equals one thousand, Wt equals one hundred, and Wr equals one.

12. The method of claim 2, wherein each individual one of the plurality of selected individuals is at least one of copied to a new population, returned to the current population, subjected to a probe site mutation based upon comparing a randomly generated number to the mutation probability and placed in the new population, subjected to a crossover of a random sized region of probe sites with another individual one of the plurality of selected individuals based upon comparing a randomly generated number to the crossover probability and placed in the new population, copied a plurality of times and each copy placed in the new population based upon comparing a randomly generated number to the reproduction probability, or combinations thereof.

13. The method of claim 12, wherein the mutation probability defaults to 75%.

14. The method of claim 12, wherein the mutation probability defaults to 100%.

15. The method of claim 12, wherein the crossover probability defaults to 75%.

16. The method of claim 12, wherein the reproduction probability defaults to zero.

17. The method of claim 2, wherein the stop criteria include a fitness value, a number of generations elapsed, and a percentage change in a best fitness value of any individual in a new population having a generation number from a best fitness value in a current population having a generation number with a specified difference in value from the current generation number.

18. The method of claim 17, wherein the fitness value is calculated by the fitness function (F)=100,000, and a best fitness is the lowest value of F.

19. The method of claim 8, wherein the determining which individuals in the current population are fittest includes a tournament, with the tournament winner having a copy placed in the new population and being returned to the current population, and may randomly be selected for a tournament more than once in a generation.

20. The method of claim 2, wherein determining which individuals in the current population are fittest and assigning a fitness value to each individual includes calculating a probe card movement vector having a maximum number of movements determined by the maximum number of times the probe card can touch the wafer.

* * * * *